US009153623B1

(12) United States Patent
Herner

(10) Patent No.: US 9,153,623 B1
(45) Date of Patent: Oct. 6, 2015

(54) THIN FILM TRANSISTOR STEERING ELEMENT FOR A NON-VOLATILE MEMORY DEVICE

(75) Inventor: Scott Brad Herner, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 681 days.

(21) Appl. No.: 13/339,919

(22) Filed: Dec. 29, 2011

Related U.S. Application Data

(60) Provisional application No. 61/428,990, filed on Dec. 31, 2010.

(51) Int. Cl.
H01L 27/24 (2006.01)

(52) U.S. Cl.
CPC ............ *H01L 27/24* (2013.01); *H01L 27/2409* (2013.01); *H01L 2924/0665* (2013.01)

(58) Field of Classification Search
CPC ................... H01L 2924/0665; H01L 27/2409
See application file for complete search history.

(56) References Cited

U.S. PATENT DOCUMENTS

| 680,652 | A | 8/1901 | Elden |
|---|---|---|---|
| 4,433,468 | A | 2/1984 | Kawamata |
| 4,684,972 | A | 8/1987 | Owen et al. |
| 4,741,601 | A | 5/1988 | Saito |
| 5,139,911 | A | 8/1992 | Yagi et al. |
| 5,242,855 | A | 9/1993 | Oguro |
| 5,278,085 | A | 1/1994 | Maddox, III et al. |
| 5,315,131 | A | 5/1994 | Kishimoto et al. |
| 5,335,219 | A | 8/1994 | Ovshinsky et al. |
| 5,360,981 | A | 11/1994 | Owen et al. |
| 5,457,649 | A | 10/1995 | Eichman et al. |
| 5,538,564 | A | 7/1996 | Kaschmitter |
| 5,541,869 | A | 7/1996 | Rose et al. |
| 5,594,363 | A | 1/1997 | Freeman et al. |

(Continued)

FOREIGN PATENT DOCUMENTS

| EP | 2405441 A1 | 1/2012 |
|---|---|---|
| EP | 2408035 A2 | 1/2012 |

(Continued)

OTHER PUBLICATIONS

Notice of Allowance for U.S. Appl. No. 13/118,258, dated Feb. 6, 2013.

(Continued)

*Primary Examiner* — Matthew Reames
(74) *Attorney, Agent, or Firm* — Amin, Turocy & Watson, LLP

(57) ABSTRACT

A non-volatile memory device structure comprises a substrate having a surface region and a first dielectric material overlying the surface region. The device structure includes a state change device overlying the first dielectric material, the state change device comprising a first wiring structure configured to spatially extend in a first direction, a switching element comprising a first amorphous silicon material overlying the first wiring structure, and a second wiring structure configured to spatially extend in a second direction perpendicular to the first direction. The device structure includes a first thin film transistor device configured to cause the state change device to change from a first state to a second state. The thin film transistor device comprises a first active region, a second active region, a gate structure overlying a gate dielectric layer, and a channel region. The first active region is in electrical contact with the second wiring structure.

16 Claims, 10 Drawing Sheets

(56) References Cited

U.S. PATENT DOCUMENTS

| | | |
|---|---|---|
| 5,614,756 A | 3/1997 | Forouhi et al. |
| 5,645,628 A | 7/1997 | Endo et al. |
| 5,714,416 A | 2/1998 | Eichman et al. |
| 5,751,012 A | 5/1998 | Wolstenholme et al. |
| 5,840,608 A | 11/1998 | Chang |
| 5,970,332 A | 10/1999 | Pruijmboom et al. |
| 5,998,244 A | 12/1999 | Wolstenholme et al. |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,259,116 B1 | 7/2001 | Shannon |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,627,530 B2 | 9/2003 | Li et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,838,720 B2 | 1/2005 | Krieger et al. |
| 6,848,012 B2 | 1/2005 | LeBlanc et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,881,994 B2 | 4/2005 | Lee et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,324,363 B2 | 1/2008 | Kerns et al. |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,566,643 B2 | 7/2009 | Czubatyi et al. |
| 7,606,059 B2 | 10/2009 | Toda |
| 7,615,439 B1 | 11/2009 | Schricker et al. |
| 7,629,198 B2 | 12/2009 | Kumar et al. |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,749,805 B2 | 7/2010 | Pinnow et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 7,972,897 B2 | 7/2011 | Kumar et al. |
| 7,984,776 B2 | 7/2011 | Beyer et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,187,945 B2 | 5/2012 | Herner |
| 8,198,144 B2 | 6/2012 | Herner |
| 8,207,064 B2 | 6/2012 | Bandyopadhyay et al. |
| 8,227,787 B2 | 7/2012 | Kumar et al. |
| 8,231,998 B2 | 7/2012 | Albano et al. |
| 8,233,308 B2 | 7/2012 | Schricker et al. |
| 8,237,146 B2 | 8/2012 | Kreupl et al. |
| 8,258,020 B2 | 9/2012 | Herner |
| 8,265,136 B2 | 9/2012 | Hong et al. |
| 8,274,812 B2 | 9/2012 | Jo et al. |
| 8,315,079 B2 | 11/2012 | Kuo et al. |
| 8,320,160 B2 | 11/2012 | Nazarian |
| 8,374,018 B2 | 2/2013 | Lu |
| 8,385,100 B2 | 2/2013 | Kau et al. |
| 8,394,670 B2 | 3/2013 | Herner |
| 8,441,835 B2 | 5/2013 | Jo et al. |
| 8,467,227 B1 | 6/2013 | Jo |
| 8,587,989 B2 | 11/2013 | Manning et al. |
| 8,658,476 B1 | 2/2014 | Sun et al. |
| 8,659,003 B2 | 2/2014 | Herner et al. |
| 2003/0141565 A1 | 7/2003 | Hirose et al. |
| 2003/0174574 A1 | 9/2003 | Perner et al. |
| 2003/0206659 A1 | 11/2003 | Hamanaka |
| 2004/0026682 A1 | 2/2004 | Jiang |
| 2004/0170040 A1 | 9/2004 | Rinerson et al. |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0175099 A1 | 8/2005 | Sarkijarvi et al. |
| 2006/0017488 A1 | 1/2006 | Hsu |
| 2006/0281244 A1 | 12/2006 | Ichige et al. |
| 2007/0008773 A1 | 1/2007 | Scheuerlein |
| 2007/0015348 A1 | 1/2007 | Hsu et al. |
| 2007/0045615 A1 | 3/2007 | Cho et al. |
| 2007/0087508 A1 | 4/2007 | Herner |
| 2007/0090425 A1 | 4/2007 | Kumar et al. |
| 2007/0091685 A1 | 4/2007 | Guterman et al. |
| 2007/0105284 A1 | 5/2007 | Herner |
| 2007/0105390 A1 | 5/2007 | Oh |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0185567 A1 | 8/2008 | Kumar et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |

(56) References Cited

U.S. PATENT DOCUMENTS

| | | |
|---|---|---|
| 2008/0232160 A1 | 9/2008 | Gopalakrishnan |
| 2008/0278990 A1 | 11/2008 | Kumar et al. |
| 2008/0280151 A1* | 11/2008 | Jourdan et al. ............... 428/450 |
| 2008/0304312 A1 | 12/2008 | Ho et al. |
| 2008/0311722 A1 | 12/2008 | Petti et al. |
| 2009/0001345 A1 | 1/2009 | Schricker et al. |
| 2009/0003717 A1 | 1/2009 | Sekiguchi et al. |
| 2009/0014707 A1 | 1/2009 | Lu et al. |
| 2009/0052226 A1 | 2/2009 | Lee et al. |
| 2009/0095951 A1 | 4/2009 | Kostylev et al. |
| 2009/0152737 A1 | 6/2009 | Harshfield |
| 2009/0168486 A1 | 7/2009 | Kumar |
| 2009/0224364 A1* | 9/2009 | Oh et al. ....................... 257/532 |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0298224 A1 | 12/2009 | Lowrey |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032638 A1 | 2/2010 | Xu |
| 2010/0032640 A1 | 2/2010 | Xu |
| 2010/0034518 A1 | 2/2010 | Iwamoto et al. |
| 2010/0044708 A1 | 2/2010 | Lin et al. |
| 2010/0046622 A1 | 2/2010 | Doser et al. |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0006275 A1 | 1/2011 | Roelofs et al. |
| 2011/0089391 A1 | 4/2011 | Mihnea et al. |
| 2011/0096588 A1* | 4/2011 | Fasoli ........................... 365/148 |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0312151 A1 | 12/2011 | Herner |
| 2011/0317470 A1 | 12/2011 | Lu et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0076203 A1 | 3/2012 | Sugimoto et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0220100 A1 | 8/2012 | Herner |
| 2012/0235112 A1 | 9/2012 | Huo et al. |
| 2012/0236625 A1 | 9/2012 | Ohba et al. |
| 2012/0269275 A1 | 10/2012 | Hannuksela |
| 2012/0305874 A1 | 12/2012 | Herner |
| 2012/0326265 A1 | 12/2012 | Lai et al. |
| 2013/0020548 A1 | 1/2013 | Clark et al. |

FOREIGN PATENT DOCUMENTS

| | | |
|---|---|---|
| JP | 2005-506703 A | 3/2005 |
| JP | 2006-032951 A | 2/2006 |
| JP | 2007-067408 A | 3/2007 |
| JP | 2007-281208 A | 10/2007 |
| JP | 2007-328857 A | 12/2007 |
| KR | 1020110014248 A | 2/2011 |
| WO | WO 03/034498 A1 | 4/2003 |
| WO | WO 2009/005699 A1 | 1/2009 |

OTHER PUBLICATIONS

International Search Report and Written Opinion for PCT/US2012/040242, filed May 31, 2012.
Office Action for U.S. Appl. No. 13/174,264 dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432 dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312 filed on Jul. 2, 2012.
Office Action for U.S. Appl. No. 13/466,008, dated Jul. 29, 2013.
Russo, Ugo et al., "Self-Accelerated Thermal Dissolution Model for Reset Programming in Unipolar Resistive-Switching Memory (RRAM) Devices", IEEE Transactions on Electron Devices), Feb. 2009, pp. 193-200, vol. 56, Issue 2.
Cagli, C. et al., "Evidence for threshold switching in the set process of NiO-based RRAM and physical modeling for set, reset, retention and disturb prediction", IEEE International Electron Devices Meeting, Dec. 15-17, 2008, pp. 1-4, San Francisco, CA.
Office Action for U.S. Appl. No. 13/077,941, dated Aug. 12, 2013.
Office Action of U.S. Appl. No. 13/436,714 dated Aug. 27, 2013.
Notice of Allowance for U.S. Appl. No. 13/679,976, dated Sep. 17, 2013.
Office Action for U.S. Appl. No. 13/189,401 dated Sep. 30, 2013.
Office Action for U.S. Appl. No. 13/462,653 dated Sep. 30, 2013.
Corrected Notice of Allowability for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665 dated Aug. 2, 2013.
Notice of Allowance for U.S. Appl. No. 13/769,152, dated Oct. 8, 2013.
Notice of Allowance for U.S. Appl. No. 13/905,074 , dated Oct. 8, 2013.
Notice of Allowability for U.S. Appl. No. 13/452,657, dated Oct. 10, 2013.
Notice of Allowance for U.S. Appl. No. 13/174,264, dated Oct. 16, 2013.
Notice of Allowability for U.S. Appl. No. 13/417,135, dated Oct. 23, 2013.
Jian Hu et al., "Area-Dependent Switching in Thin Film-Silicon Devices", Materials Research Society, Mal. Res. Soc. Symp Proc., 2003, pp. A18.3.1-A18.3.6, vol. 762.
André Dehon, "Array-Based Architecture for FET-Based, Nanoscale Electronics", IEEE Transactions on Nanotechnology, Mar. 2003, pp. 23-32, vol. 2, No. 1, IEEE.

(56) References Cited

OTHER PUBLICATIONS

Herb Goronkin et al., "High-Performance Emerging Solid-State Memory Technologies", MRS Bulletin, www.mrs.org/publications/bulletin, Nov. 2004, pp. 805-813.

Gerhard Müller et al., "Status and Outlook of Emerging Nonvolatile Memory Technologies", IEEE, 2004, pp. 567-570.

A.E. Owen et al., "Memory Switching in Amorphous Silicon Devices", Journal of Non-Crystalline Solids 59 & 60, 1983, pp. 1273-1280, North Holland Publishing Company/Physical Society of Japan.

J. Campbell Scott, "Is There an Immortal Memory?", www.sciencemag.org, Apr. 2, 2004, pp. 62-63, vol. 304 No. 5667, American Association for the Advancement of Science.

S.H. Lee et al., "Full Integration and Cell Characteristics for 64Mb Nonvolatile PRAM", 2004 Symposium on VLSI Technology Digest of Technical Papers, IEEE, 2004, pp. 20-21.

Stephen Y. Chou et al., "Imprint Lithography With 25-Nanometer Resolution", Science, Apr. 5, 1996, pp. 85-87, vol. 272, American Association for the Advancement of Science.

S. Zankovych et al., "Nanoimprint Lithography: challenges and prospects", Nanotechnology, 2001, pp. 91-95, vol. 12, Institute of Physics Publishing.

A. Avila et al., "Switching in coplanar amorphous hydrogenated silicon devices", Solid-State Electronics, 2000, pp. 17-27, vol. 44, Elsevier Science Ltd.

Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.

S. Hudgens et al., "Overview of Phase-Change Chalcogenide Nonvolatile Memory Technology", MRS Bulletin, www.mrs.org/publications/bulletin, Nov. 2004, pp. 829-832.

K. Terabe et al., "Quantized conductance atomic switch", Nature, www.nature.com/nature, Jan. 6, 2005, pp. 47-50, vol. 433, Nature Publishing Group.

Michael Kund et al., "Conductive bridging RAM (CBRAM): An emerging non-volatile memory technology scalable to sub 20nm", IEEE, 2005.

W. Den Boer, "Threshold switching in hydrogenated amorphous silicon", Appl. Phys. Letter, 1982, pp. 812-813, vol. 40, American Institute of Physics.

P.G. Lecomber et al., "The Switching Mechanism in Amorphous Silicon Junctions", Journal of Non-Crystalline Solids, 1985, pp. 1373-1382, vol. 77 & 78, Elsevier Science Publishers B.V., North Holland Physics Publishing Division, North-Holland, Amsterdam.

A. E. Owen et al., "Switching in amorphous devices", Int. J. Electronics, 1992, pp. 897-906, vol. 73, No. 5, Taylor and Francis Ltd.

M. Jafar et al., "Switching in amorphous-silicon devices", Physical Review B, May 15, 1994, pp. 611-615, vol. 49, No. 19, The American Physical Society.

Alexandra Stikeman, "Polymer Memory—The plastic path to better data storage", Technology Review, www.technologyreview.com, Sep. 2002, pp. 31.

Yong Chen et al., "Nanoscale molecular-switch crossbar circuits", Nanotechnology, 2003, pp. 462-468, vol. 14, Institute of Physics Publishing Ltd.

C. P. Collier et al., "Electronically Configurable Molecular-Based Logic Gates", Science Jul. 16, 1999, pp. 391-395, vol. 285, No. 5426, American Association for the Advancement of Science.

Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.

Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.

Sung-Hyun Jo et al., "A Silicon-Based Crossbar Ultra-High-Density Non-Volatile Memory", SSEL Annual Report 2007.

International Search Report for PCT/US2009/060023 filed on Oct. 8, 2009.

Rainer Waser et al., "Nanoionics-based resistive switching memories", Nature Materials, Nov. 2007, pp. 833-835, vol. 6, Nature Publishing Group.

Written Opinion of the International Searching Authority for PCT/US2009/060023 filed on Oct. 8, 2009.

Ex parte Quayle Action for U.S. Appl. No. 12/826,653 dated May 8, 2012.

International Search Report for PCT/US2011/040090 filed on Jun. 10, 2011.

Written Opinion of the International Searching Authority for PCT/US2011/040090 filed on Jun. 10, 2011.

Notice of Allowance for U.S. Appl. No. 13/158,231 dated Apr. 17, 2012.

Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.

International Search Report and Written Opinion for PCT/US2011/046035 filed on Jul. 29, 2011.

Office Action for U.S. Appl. No. 12/861,650 dated Jan. 25, 2012.
Notice of Allowance for U.S. Appl. No. 12/861,650 dated Jun. 19, 2012.

Sung Hyun Jo et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.

Kuk-Hwan Kim et al., "Nanoscale resistive memory with intrinsic diode characteristics and long endurance," Applied Physics Letters, 2010, pp. 053106-1-053106-3, vol. 96, American Institute of Physics.

Sung Hyun Jo et al., "Si-Based Two-Terminal Resistive Switching Nonvolatile Memory", IEEE, 2008.

Sung Hyun Jo et al., "Nanoscale Memristor Device as Synapse in Neuromorphic Systems", Nano Letters, 10, 1297-1301, 2010, pubs.acs.org/NanoLett, A-E, American Chemical Society Publications.

Wei Lu et al., "Nanoelectronics from the bottom up", Nature Materials, www.nature.com/naturematerials, Nov. 2007, pp. 841-850, vol. 6, Nature Publishing Group.

Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.

Sung Hyun Jo et al., "Experimental, Modeling and Simulation Studies of Nanoscale Resistance Switching Devices", $9^{th}$ Conference on Nanotechnology, IEEE, 2009, pp. 493-495.

Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.

Sung Hyun Jo et al., "Si Memristive Devices Applied to Memory and Neuromorphic Circuits", Proceedings of 2010 IEEE International Symposium on Circuits and Systems, 2010, pp. 13-16.

Wei Lu et al., "Supporting Information", 2008.

Sung Hyun Jo et al., "High-Density Crossbar Arrays Based on a Si Memristive System", Nano Letters, 2009, pp. 870-874, vol. 9 No. 2, American Chemical Society Publications.

Sung Hyun Jo et al., "High-Density Crossbar Arrays Based on a Si Memristive System", Supporting Information, 2009, pp. 1-4.

Sung Hyun Jo et al., "Programmable Resistance Switching in Nanoscale Two-Terminal Devices", Nano Letters, 2009, pp. 496-500, vol. 9 No. 1, American Chemical Society Publications.

Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.

S. K. Dey, "Electrothermal model of switching in amorphous silicon films", J. Vac. Sci. Technol., Jan./Feb. 1980, pp. 445-448, vol. 17, No. 1, American Vacuum Society.

J. Hajto et al., "The Programmability of Amorphous Silicon Analogue Memory Elements", Mat. Res. Soc. Symp. Proc., 1990, pp. 405-410, vol. 192, Materials Research Society.

(56) References Cited

OTHER PUBLICATIONS

M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of Cr/p+ a-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Amorphous & Microcrystalline Semiconductor Devices: vol. 2, Materials and Device Physics", Mar. 1, 2004, pp. 640-700, Artech House Publishers.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A. J. Holmes et al., "Design of Analogue Synapse Circuits using Non-Volatile a-Si:H Memory Devices", Proceedings of ISCAS, 1994, pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñé et al., "Nondestructive multiple breakdown events in very thin $SiO_2$ films", Applied Physics Letters, 1989, pp. 128-130, vol. 55.
Herve Marand et al., MESc. 5025 lecture notes: Chapter 7. Diffusion, University of Vermont, http://www.files.chem.vt.edu/chem-dept/marand/MEScchap6-1c.pdf.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.
Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Office Action for U.S. Appl. No. 12/861,650 dated Oct. 16, 2012.
Notice of Allowance for U.S. Appl. No. 12/894,087 dated Oct. 25, 2012.
Notice of Allowance for U.S. Appl. No. 13/149,807 dated Oct. 29, 2012.
Notice of Allowance for U.S. Appl. No. 12/861,666 dated Nov. 14, 2012.
Office Action for U.S. Appl. No. 13/156,232, dated Nov. 26, 2012.
Notice of Allowance for U.S. Appl. No. 13/290,024 dated Nov. 28, 2012.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al., "Aluminum spiking at contact windows in Al/Ti—W/Si", Appl. Phys. Lett., Jan. 25, 1988, pp. 272-274, vol. 52 No. 4, American Institute of Physics.
J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 dated Aug. 8, 2012.
Office Action for U.S. Appl. No. 13/417,135 dated Oct. 9, 2012.
Notice of Allowance for U.S. Appl. No. 13/532,019 dated Nov. 14, 2012.
Office Action for U.S. Appl. No. 13/149,653 dated Nov. 20, 2012.
Notice of Allowance for U.S. Appl. No. 12/814,410 dated Jan. 8, 2013.
Corrected Notice of Allowance for U.S. Appl. No. 12/861,666 dated Jan. 11, 2013.
Supplemental Notice of Allowance for U.S. Appl. No. 12/894,087 dated Jan. 11, 2013.
Notice of Allowance for U.S. Appl. No. 13/314,513 dated Jan. 24, 2013.
Office Action of U.S. Appl. No. 13/436,714 dated Dec. 7, 2012.
Office Action for U.S. Appl. No. 13/434,567, dated Feb. 6, 2014.
Office Action for U.S. Appl. No. 13/620,012, dated Feb. 11, 2014.
Notice of Allowance for U.S. Appl. No. 13/468,201, dated Feb. 20, 2014.
Office Action for U.S. Appl. No. 12/625,817, dated Feb. 28, 2014.
Office Action for U.S. Appl. No. 12/835,704, dated Mar. 14, 2014.
Office Action for U.S. Appl. No. 13/870,919, Dated Apr. 3, 2014.
Office Action for U.S. Appl. No. 13/167,920, dated Mar. 12, 2014.
International Search Report and Written Opinion for PCT/US2013/077628, filed on Dec. 23, 2013.
Office Action for U.S. Appl. No. 13/143,047, dated Apr. 11, 2014.
Office Action for U.S. Appl. No. 13/761,132, dated Apr. 25, 2014.
Office Action for U.S. Appl. No. 13/174,264, dated Mar. 6, 2013.
Office Action for U.S. Appl. No. 12/861,432, dated Mar. 29, 2013.
International Search Report and Written Opinion for PCT/US2012/045312, filed on Jul. 2, 2012.
Russo, Ugo et al., "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, No. 2.
Office Action for U.S. Appl. No. 13/436,714, dated Aug. 27, 2013.
Office Action for U.S. Appl. No. 13/189,401, dated Sep. 30, 2013.
Office Action for U.S. Appl. No. 13/462,653, dated Sep. 30, 2013.
Corrected Notice of Allowance for U.S. Appl. No. 13/733,828, dated Oct. 1, 2013.

(56) References Cited

OTHER PUBLICATIONS

Office Action for U.S. Appl. No. 13/594,665, dated Aug. 2, 2013.
Notice of Allowance for U.S. Appl. No. 13/905,074, dated Oct. 8, 2013.
Notice of Allowance for U.S. Appl. No. 13/452,657, dated Oct. 10, 2013.
Notice of Allowance for U.S. Appl. No. 13/417,135, dated Oct. 23, 2013.
Notice of Allowance for U.S. Appl. No. 13/725,331, dated Jan. 17, 2014.
Office Action for U.S. Appl. No. 13/739,283, dated Jan. 16, 2014.
Office Action for U.S. Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Office Action for U.S. Appl. No. 14/072,657, dated Jun. 17, 2014.

* cited by examiner

THIN FILM TRANSISTOR STEERING ELEMENT FOR A NON-VOLATILE MEMORY DEVICE

CROSS REFERENCE TO RELATED APPLICATIONS

This application claims priority to provisional application 61/428,990 filed Dec. 31, 2010, commonly assigned and incorporated by reference in its entirety herein.

BACKGROUND

The present invention is generally related to resistive switching devices. More particularly, embodiments according to the present invention provide a method and a structure for forming a resistive switching device coupled to a thin film transistor device. The present invention can be applied to non-volatile memory devices but it should be recognized that the present invention can have a much broader range of applicability.

The success of semiconductor devices has been mainly driven by an intensive transistor down-scaling process. However, as field effect transistors (FET) approach sizes less than 100 nm, problems such as short channel effect can degrade device performance. Moreover, such sub 100 nm device size can lead to sub-threshold slope non-scaling and also increases power dissipation. It is generally believed that transistor-based memories such as those commonly known as Flash may approach an end to scaling within a decade. Flash memory is one type of non-volatile memory device.

Other non-volatile random access memory (RAM) devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures to couple with silicon-based devices to form a memory cell, which lack one or more key attributes. For example, Fe-RAM and MRAM devices have fast switching characteristics and good programming endurance, but their fabrication is not CMOS compatible and size is usually large. Power dissipation during switching for a PCRAM device is usually large. Organic RAM or ORAM is incompatible with large volume silicon-based fabrication and device reliability is usually poor.

From the above, a new semiconductor device structure and integration is desirable.

BRIEF SUMMARY OF THE PRESENT INVENTION

The present invention is generally related to resistive switching devices. More particularly, embodiments according to the present invention provide a method and a structure for forming a resistive switching device coupled to a thin film transistor device. The present invention can be applied to non-volatile memory devices but it should be recognized that the present invention can have a much broader range of applicability.

In a specific embodiment, a non-volatile memory device structure is provided. The non-volatile memory device includes a substrate having a surface region and a first dielectric material overlying the surface region of the substrate. The non-volatile memory device includes a state change device overlying the first dielectric material. In a specific embodiment, the state change device includes a first wiring structure configured to spatially extend in a first direction, a second wiring structure configured to spatially extend in a second direction perpendicular to the first direction, and a switching element comprising at least a first amorphous silicon material sandwiched between the first wiring structure and the second wiring structure, overlying the first wiring structure. In a specific embodiment, the second wiring structure having a portion comprising a metal material in contact with the switching element. The nonvolatile memory device further includes a first thin film transistor device operably coupled to the state change device. The thin film transistor device includes a first active region, a second active region, a gate structure and a channel region. The gate structure overlies a gate dielectric material in a specific embodiment. In a specific embodiment, the first active region is in electrical contact with the second wiring structure. In a specific embodiment, the gate structure includes at least a polysilicon material. Each of the channel region, the first active region, and the second active region is formed from at least a second amorphous silicon material. Additionally, each of the first active region and the second active region has a suitable impurity characteristic. The channel region can be intrinsic or slightly doped depending on the application. In a specific embodiment, the polysilicon material may be doped with a suitable impurity species to improve a conducting characteristic of the polysilicon material. In certain embodiment, for a low temperature deposition process, the polysilicon material may be a polysilicon germanium (SiGe) material, which can have a deposition temperature of less than about 600 Degree Celsius. For other embodiment, the gate structure can be a metal material such as aluminum, which can also be deposited at a temperature no greater than about 600 Degree Celsius for to maintain, for example, amorphous silicon to be in a suitable crystalline state, among others. In a specific embodiment, the thin film transistor device is configured to deliver the current to cause the state change device to change from a first state to a second state.

In a specific embodiment, a method of forming a non-volatile memory device is provided. The method includes providing a substrate having a surface region and forming a first dielectric material overlying the surface region. The method includes forming a first wiring structure overlying the first dielectric material. In a specific embodiment, the first wiring structure is elongated in shape and spatially configured to extend in a first direction. A stack of material including a polysilicon material, a first amorphous silicon material, a metal material, and an adhesion layer material is formed overlying at least the first wiring structure. The stack of material is subjected to a patterning and etching process to form one or more pillar structures from the stack of material while maintaining contact with at least a portion of the first wiring structure. The method includes depositing a second dielectric material overlying the plurality of pillar structure and subjecting the second dielectric material to a planarizing process to expose a top surface region of the adhesion material of the pillar structure. A top wiring structure is formed overlying the pillar structure. The top wiring structure is spatially configured to extend in a second direction orthogonal to the first direction. The top wiring structure includes at least a first top wiring and a second top wiring in a specific embodiment. The method forms a state change device from the first wiring structure, the pillar structure, and the first top wiring in a specific embodiment. In a specific embodiment, a third dielectric material is deposited overlying the top wiring structure. The third dielectric material is subjected to a planarizing process to expose a surface of the second wiring structure while maintaining a portion between the second wiring structures to isolate the second wiring structure. The method includes depositing a second amorphous silicon material overlying the third dielectric material and the exposed surface of the second wiring structure. A gate dielectric material is deposited overlying the second amorphous silicon material. The method includes forming a gate structure overlying the gate dielectric material. The second amorphous silicon material is subjected to an implantation process to form a first impurity region and a second impurity region using the gate structure as a mask. In a specific embodiment, a thin film transistor device is formed from at least the gate structure, the gate dielectric, the first impurity region, and the second impurity region. The first impurity region forms a source region and the second impurity region forms a drain region for the thin film transistor device. Alternatively, the first impurity region forms a drain region and the second impurity region forms a source region for the thin film transistor device. In a specific embodiment, the first impurity region is in contact with at least a portion of the first top wiring, and the second impurity region is in contact with at least a portion of the second bottom wiring. In a specific embodiment, a channel region is formed from the second amorphous silicon material in between the first active region and the second active region abutting the first active region and the second active region in a specific embodiment.

Alternatively, instead of a pillar structure, a second dielectric material can be deposited over the first wiring layer, and one or more openings can be formed to form a trench structure overlying a top surface region of the first wiring structure. In a specific embodiment, the amorphous Si switching material and the metal material (for example, silver material) can be deposited in a portion of each of the one or more openings. In a specific embodiment, the amorphous Si and metal can be isolated, whereupon a top wiring structure can be formed in contact with the metal material.

Many benefits can be achieved by ways of the present invention. Embodiments according to the present invention provide a method and a structure for a non-volatile memory device. The non-volatile memory device includes a thin film transistor for controlling a voltage applied to a resistive switching device or a state change device. Use of a thin film transistor allows better controlled current and voltage to be delivered to the memory cell and independent of location within a large array of cells. The location of the cell may influence the current and voltage by a variation of a length of the interconnect to get from a more remote source. For example, "near" cells which have short interconnect distances from a power source will experience less delay and more current compared to "far" cells where there is a longer interconnect, and thus a higher resistance. The thin film transistor has a channel region fabricated from an amorphous silicon material or an organic material thus eliminating the use of a single crystal silicon material. Alternatively a polysilicon material can be used for the channel region. The mobility of carriers (holes or electrons) in a polysilicon material is higher than that of, for example, amorphous silicon material thus resulting in a faster switch time. Additionally, at least one of the source/drain regions of the thin film transistor is directly connected to a portion of the top wiring structure, or part of the top wiring structure of the resistive switching device, further simplify the fabrication process. Depending on the embodiments, the non-volatile memory device can be built on any substrate, including glass, polymer, or metal and easily integrated in other devices, for example, light emitting diodes, or liquid crystal displays that are not based on single crystal silicon substrate. Depending on the embodiment, one or more of these benefits may be achieved. One skilled in the art would recognize other variations, modifications, and alternatives.

DETAILED DESCRIPTION OF THE PRESENT INVENTION

Embodiments according to the present invention is related to state change devices or resistive switching devices. More particularly, embodiments according to the present invention provide a method and a structure for a state change device having a thin film transistor as a controlling element. The thin film transistor device controls a voltage applied to the state change device to change a resistance characteristic of the state change device. The present invention has been applied to a non-volatile memory device. But it should be recognized that the present invention can have a broader range of applicability.

Figure 1:
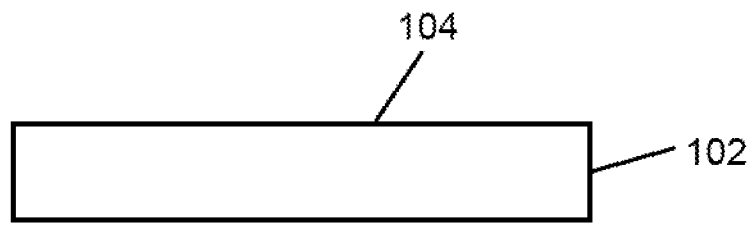
FIGS. 1-20 are simplified diagrams illustrating a method of forming a non-volatile memory device having a thin film transistor steering element according to an embodiment of the present invention.

In a specific embodiment a method of forming a non-volatile memory device is provided as illustrated in FIG. 1-20. As shown in FIG. 1, a substrate 102 having a surface region 104 is provided. The substrate can be a semiconductor material, an insulator material, or a metal material depending on the application. The semiconductor material can be silicon material, including single crystal silicon material, or a silicon germanium material or a silicon on insulator substrate depending on the application. The insulator material can be a glass substrate or a polymer material, or other suitable insulator materials depending on the application.

Figure 2:
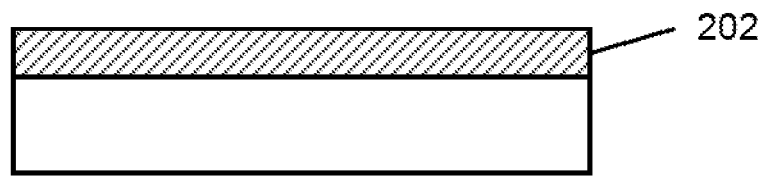

Referring to FIG. 2, for a semiconductor substrate or a metal substrate, a first dielectric material 202 is formed overlying the surface region of the substrate. The first dielectric material can be silicon oxide, silicon nitride, a high K dielectric, or a low K dielectric or a combination including on a multilayer dielectric stack depending on the embodiment.

Figure 3:
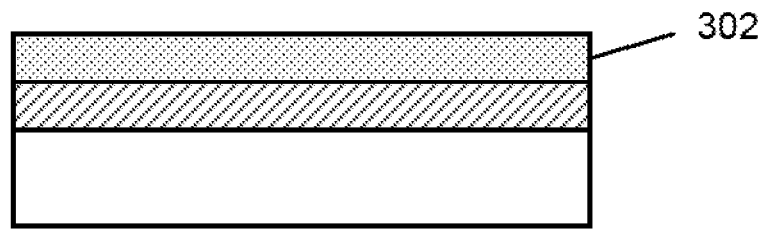
Figure 4:
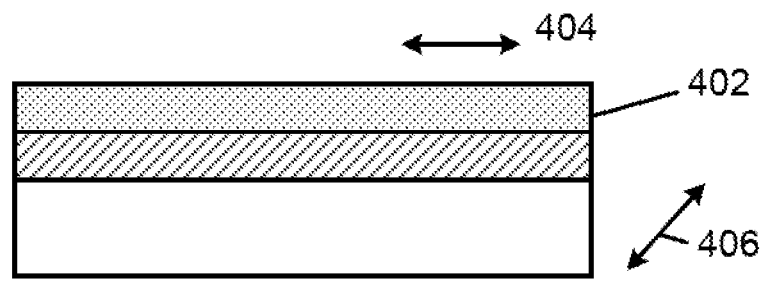

As shown in FIG. 3, the method deposits a bottom wiring material 302 overlying the first dielectric material. The terms "top" or "bottom" are reference only and not construed to be limiting. The bottom wiring material can be a suitable metal material or a doped semiconductor material, depending on the application. For example, the bottom wiring material can be those commonly used in semiconductor transistor processing such as copper, tungsten, or aluminum, and others. The first wiring material further includes one or more adhesion layer or diffusion layer allowing the first wiring material to have a proper adhesion to the first dielectric material. The adhesion layer can include titanium, titanium nitride, tungsten nitride, tungsten, tantalum, tantalum nitride, and others.

Figure 5:
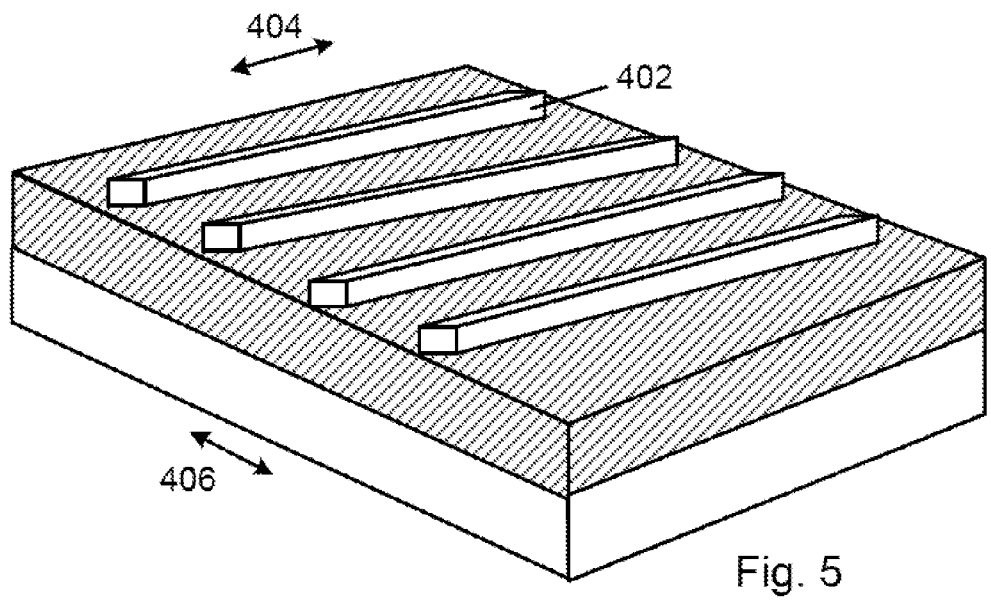
Figure 6:
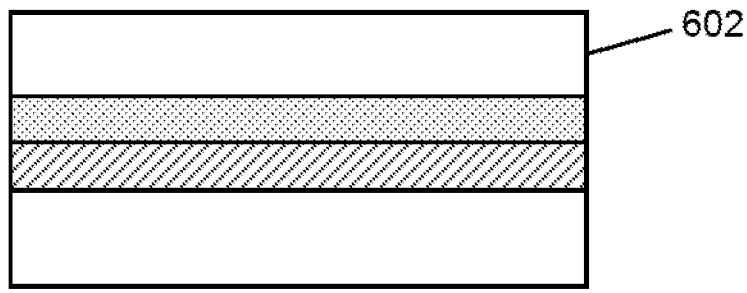

In a specific embodiment, the method includes subjecting the bottom wiring material to a first patterning and etching process to form one or more bottom wiring structure 402. The bottom wiring structure is elongated in shape and configured to spatially extend in a first direction 404 in a specific embodiment. As shown, direction 404 and 406 are orthogonal to each other. A perspective view is illustrated in FIG. 5. Like references are used in FIG. 5 as in FIG. 4, and not construed to be limiting.

In a specific embodiment, the method includes depositing a second dielectric material 602 overlying the bottom wiring structure. The second dielectric material is subjected to a first planarizing process to expose a surface region of the first wiring structure and to isolate the bottom wiring structure in a specific embodiment.

Figure 7:
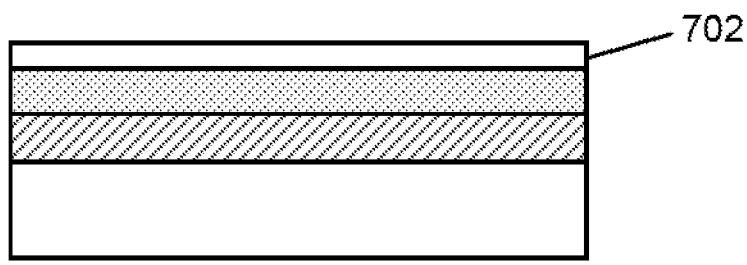

As shown in FIG. 7, the method includes depositing a first polysilicon material 702 overlying the exposed surface region of the bottom wiring structure and the second dielectric material. The first polysilicon material is having a p+ impurity characteristic in a specific embodiment. In a specific embodiment, the p+ impurity characteristic is provided by a boron species at a concentration of about 1e18 to about 1e21 atoms per cm$^3$. Other suitable p+ impurity species may also be used. These other p+ impurity species can include aluminum, indium, gallium and others.

Figure 8:
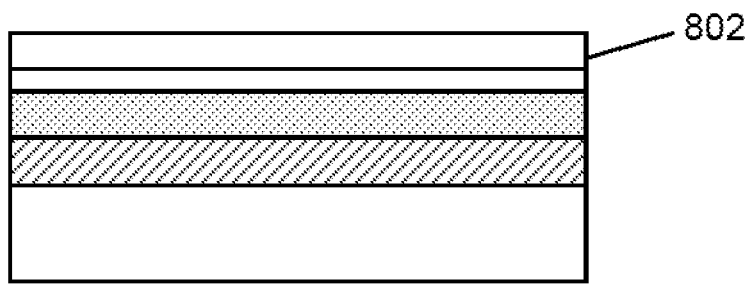

In a specific embodiment, the method includes depositing a switching material 802 overlying the p+ polysilicon material as shown in FIG. 8. The switching material is characterized by a state, for example, a resistance state dependent on an electric field in the switching material. In a specific embodiment, the switching material is an amorphous silicon material. The amorphous silicon material has essentially intrinsic semiconductor characteristic and not intentionally doped in a specific embodiment. In various embodiments, the amorphous silicon is also referred to as non-crystalline silicon (nc-Si). nc-Si non-volatile resistive switching material may be fabricated using existing CMOS technologies. In an exemplary process, a mixture of silane (SiH4)(45 sccm) and Helium (He) (500 sccm) is used to form an a-Si layer with a deposition rate of 80 nm per minute (T=260° C., P=600 mTorr) during PECVD. In another exemplary process, a mixture of silane (SiH4)(190 sccm) and Helium (He) (100 sccm) is used to form an a-Si layer with a deposition rate of 2.8 Å per second (T=380° C., P=2.2 Torr) during PECVD. In another exemplary process, silane (SiH4 80 sccm) or disilane is used to form an a-Si layer with a deposition rate of 2.8 nm per minute (T=585° C., P=100 mTorr) during LPCVD. Portions of poly-silicon grains may form during the LPCVD process and result in an amorphous-poly silicon film. In various embodiments, no p-type, n-type, or metallic impurities are intentionally added to the deposition chamber while forming the amorphous silicon material. Accordingly, when deposited, the amorphous silicon material is substantially free of any p-type, n-type or metallic dopants, i.e. the amorphous silicon material is undoped.

Figure 9:
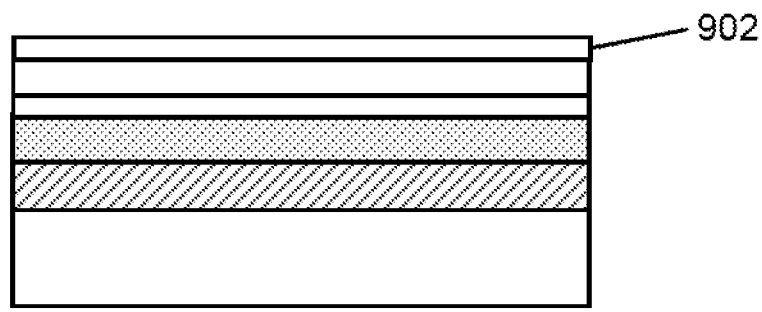

In a specific embodiment, a metal material 902 is formed overlying the switching material as shown in FIG. 9. For amorphous silicon as the switching material, the metal material can be silver, gold, platinum, palladium, aluminum, nickel, and others. The metal material has a suitable diffusion characteristic in the amorphous silicon material upon application of a voltage or in a presence of a suitable electric field in a specific embodiment. In certain embodiments, the metal material is silver.

In other embodiments, a thin layer of oxide, (not specifically shown) is formed prior to the deposition of the metal material 902 on top of the amorphous silicon 802. This interposing thin layer of oxide may be naturally or specifically grown or formed, and one or more etch operations (e.g. HF etch, Argon etch) may help control the thickness of this oxide layer. In some embodiments, the thickness of the oxide prior to deposition of the metal material (e.g. silver) 902 may range from about 20 angstroms to about 50 angstroms; in other embodiments, the thickness may range from about 30 angstroms to about 40 angstroms; or the like.

Depending on the embodiment, a diffusion barrier material or an adhesion layer material may be formed overlying the metal material 902. The adhesion layer material inhibits the metal material to diffuse to other parts of the device to cause undesirable electric shorts. In a specific embodiment, the diffusion barrier layer material can be titanium nitride, titanium, tungsten nitride, tantalum, tantalum nitride, and others.

Figure 10:
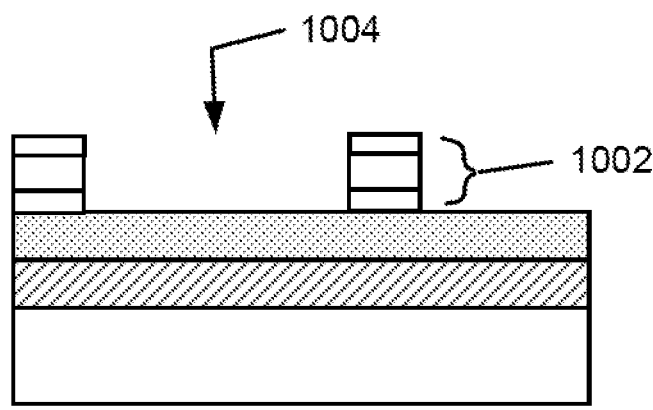

The method subjects a stack of material comprising the diffusion barrier material, the metal material, the p+ polysilicon material to a patterning and etching process to form one or more pillar structures 1002 overlying at least the bottom wiring structure as shown in FIG. 10. The one or more pillar structures are separated by a gap region 1004. The patterning and etching process may use the diffusion barrier material as a hard mask in a specific embodiment.

Figure 11:
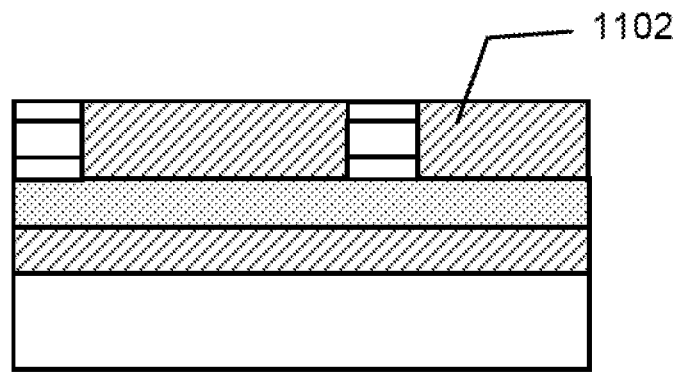

Referring to FIG. 11. The method includes forming a second dielectric material 1102 overlying the one or more pillar structure and fills the gap region 1004 as illustrated in FIG. 11. The method further subjects the second dielectric material 1102 to a planarizing process to remove the second dielectric material from a top surface of each of the one or more pillar structures and to isolate the one or more pillar structures 1002 in a specific embodiment.

Figure 12:
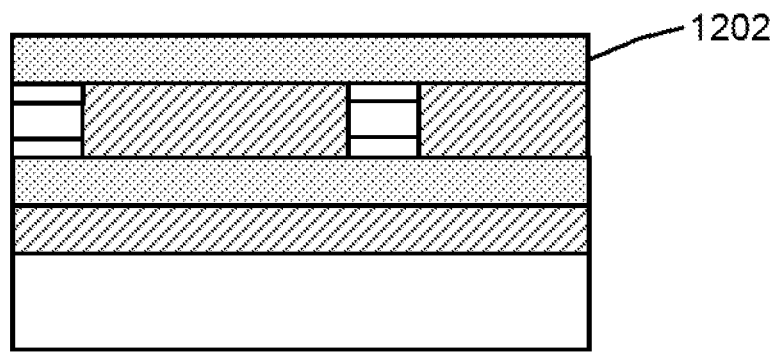
Figure 13:
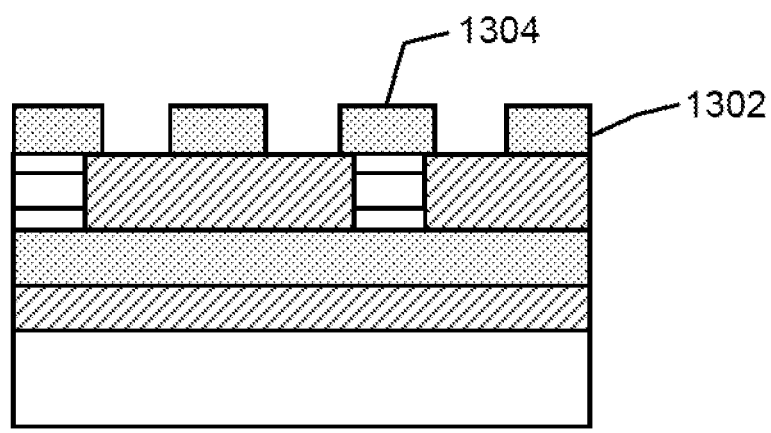

The method forms a top wiring material 1202 overlying the planarized second dielectric material and the exposed top surface region of the pillar structure as illustrated in FIG. 12. The top wiring material can be a suitable metal material such as those commonly used for interconnect in semiconductor device processing. As merely an example, top wiring material 1202 can be tungsten, aluminum, or copper, and others. Top wiring material 1202 can also be a suitably doped semiconductor depending on the application. In a specific embodiment, top wiring material 1202 is subjected to a third patterning and etching process to form a top wiring structure for the state change device. The top wiring structure is configured to extend in a second direction at an angle to the first direction of bottom wiring structure 402. In a specific embodiment, the top wiring structure is spatially configured to extend orthogonal to the first direction as illustrated in FIG. 13. As merely an example, the top wiring structure includes a first top wiring structure 1302 and a second top wiring structure 1304. The first top wiring structure 1302 overlies the second dielectric material while second top wiring structure 1304 overlies a pillar structure. In a specific embodiment, the pillar structure including a switching element is disposed in an intersection region formed from second top wiring structure 1304 and a bottom wiring structure 402, as shown.

Figure 14:
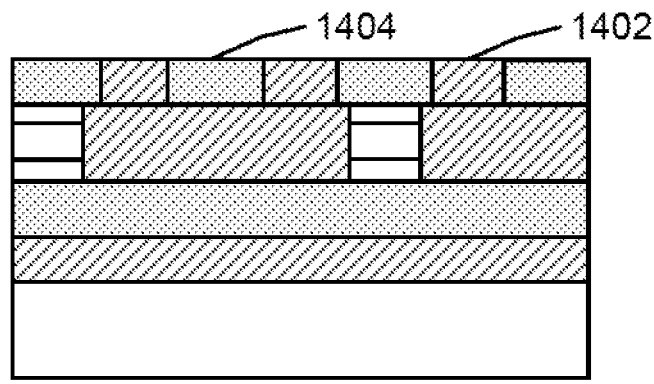

In a specific embodiment, the method includes forming a third dielectric material 1402 overlying the top wiring structure and fills a void region between neighboring top wiring structures. As shown in FIG. 14, the method further subjects the third dielectric material 1402 to a planarizing process to expose a surface region of the top wiring structure 1404 and to isolate the top wiring structure in a specific embodiment.

Figure 15:
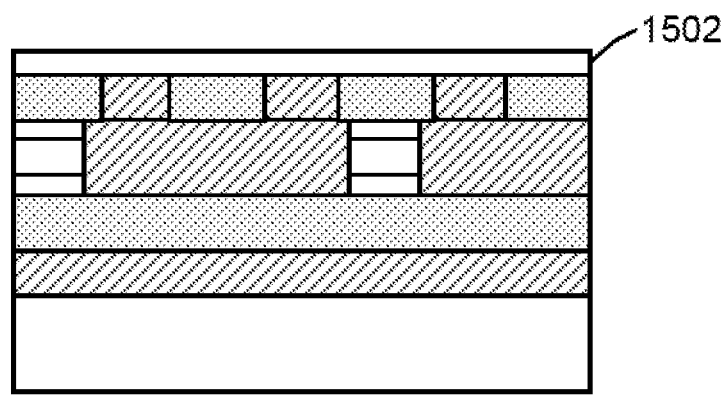
Figure 16:
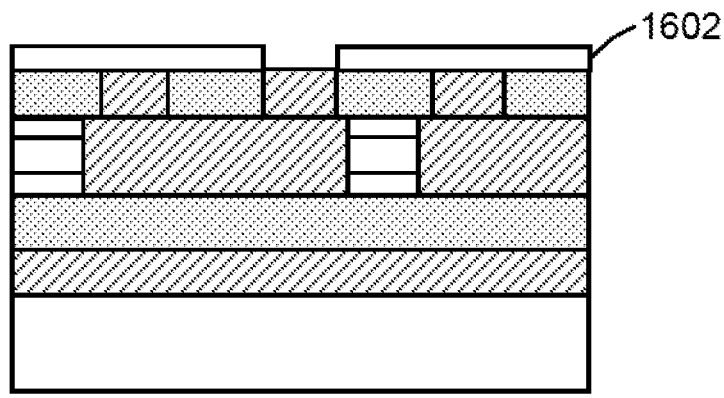

Referring to FIG. 15, the method deposits a second amorphous silicon material 1502 overlying the third dielectric material and the exposed surface region of the top wiring structure 1404. The second amorphous silicon material has an intrinsic semiconductor characteristic but can be slightly doped depending on the application. The second amorphous silicon material 1502 is subjected to a patterning and etching process to form one or more second amorphous silicon region 1602 as shown in FIG. 16. Each of the one or more amorphous silicon region overlies the first top wiring structure 1302 and the second top wiring structure 1304 and the third dielectric material 1402 in between the first top wiring structure and the second top wiring structure in a specific embodiment.

Figure 17:
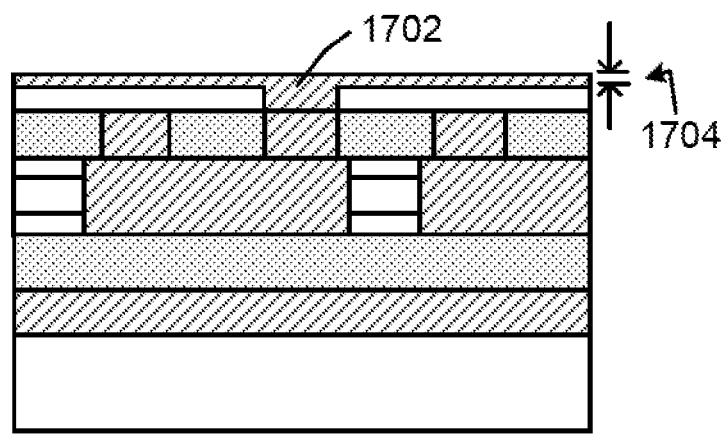

Referring to FIG. 17, in a specific embodiment, the method includes forming a fourth dielectric material 1702 overlying the one or more amorphous silicon regions. The fourth dielectric material may be subjected to a planarizing process to form a thickness of dielectric material 1704 overlying the one or more amorphous silicon region in a specific embodiment. The fourth dielectric can be silicon oxide, silicon nitride, aluminum oxide, hafnium oxide, or hafnium silicate (HfSiO2), a dielectric stack comprising alternating layers of silicon oxide and silicon nitride (ONO), or any combination thereof. In other embodiments, the planarizing process may be optional.

Figure 18:
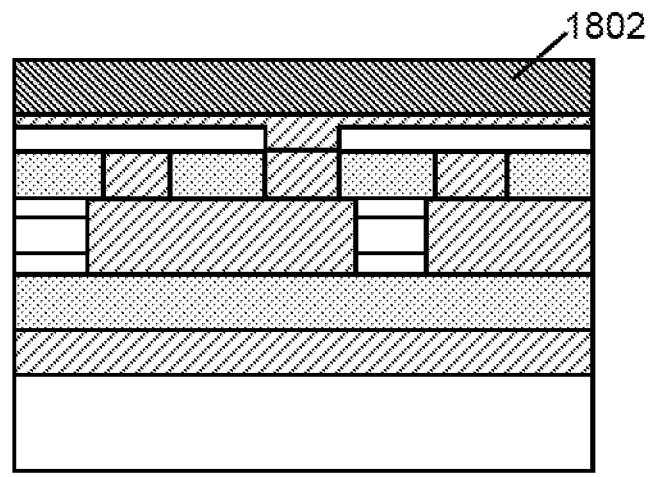

Referring to FIG. 18. The method forms a gate material 1802 overlying the planarized fourth dielectric material 1702. The gate material is a suitable conductive material. The conductive material can be a polysilicon material or a metal material depending on the embodiment. The polysilicon material can have a p-type impurity characteristic or an n-type impurity characteristic upon deposition depending on the application. Alternatively, the polysilicon material may be undoped and the impurity can be formed in a subsequent implantation process.

Figure 19:
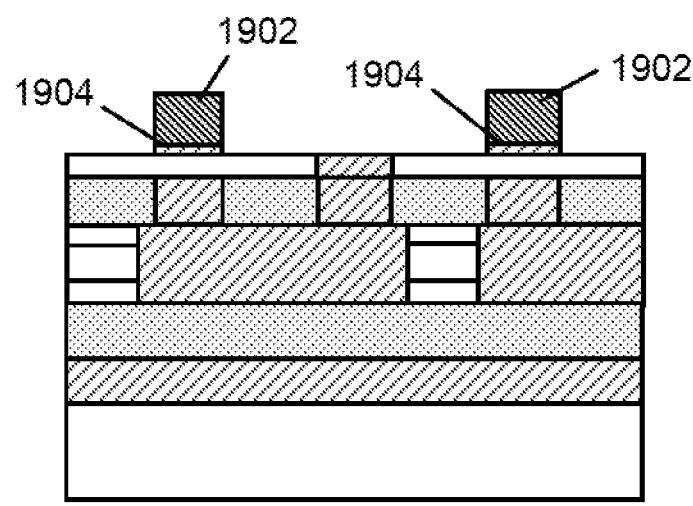

Referring to FIG. 19, gate material 1802 is subjected to a patterning and etching process to form a gate structure 1902. The patterning and etching process can remove a portion of the fourth dielectric material to form a gate dielectric 1904 to insulate the respective gate structures from the first amorphous silicon region and the second amorphous silicon region in a specific embodiment.

Figure 20:
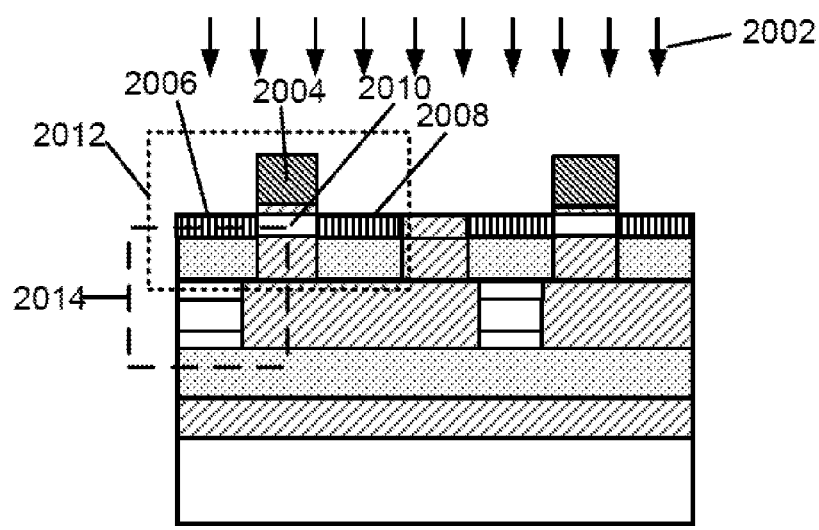

Referring to FIG. 20. The method subjects the second amorphous silicon material in the first amorphous silicon region and the second amorphous silicon region to an implantation process 2002 to form a first impurity region 2006 and a second impurity region 2008 abutting a channel region 2008 in a vicinity of the surface region of the second amorphous silicon material. As shown, the gate structure 2004 is used as a mask for the implantation process. For polysilicon material as the gate material, the implantation process also causes the polysilicon material to be doped with the impurity species in a specific embodiment. In certain embodiments, the method can further form a silicide material from the polysilicon material of the gate structure and the second amorphous silicon material from the first impurity region and the second amorphous silicon material from the second impurity region to improve the respective conductive characteristic. In a specific embodiment, gate structure 2004 including the gate dielectric, first impurity region 2006, second impurity region 2008, and channel region 2010 form a thin film transistor 2012 for a control transistor for switching device 2014. Depending on the embodiment, a sidewall spacer structure can be formed overlying a portion of the gate structure to protect the gate structure. Of course, one skilled in the art would recognize other variations, modifications, and alternatives.

Figure 21:
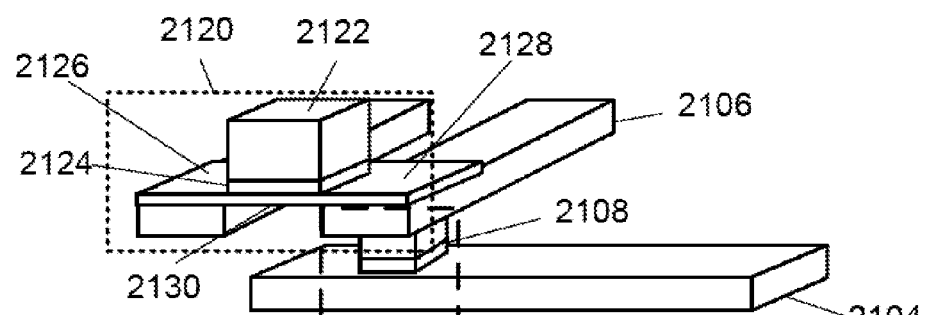
FIG. 21 is a simplified diagram illustrating a non-volatile memory device structure having a thin film transistor steering element according to an embodiment of the present invention.

FIG. 21 is a simplified perspective view of a non-volatile memory device using a thin film transistor as a control transistor according to an embodiment of the present invention. A resistive switching device or a state change device 2102 is shown. Resistive switching device 2102 includes a bottom wiring structure 2104, a first top wiring structure 2106 and at least a switching material 2108 sandwiched between the bottom wiring structure 2104 and the first top wiring structure 2106. As shown, bottom wiring structure 2104 is elongated in shape and spatially configured to extend in a first direction. The top wiring structure 2106 is also elongated in shape and spatially configured to extend in a second direction orthogonal to the first direction in a specific embodiment. In a specific embodiment, the switching material 2108 includes a first amorphous silicon material having an intrinsic semiconductor characteristic. Resistive switching device 2102 further includes a p+ polysilicon material as a contact layer interposed between the amorphous silicon material and the bottom wiring material in certain embodiments. The bottom wiring structure 2104 includes at least a first conductor material such as copper, tungsten, silver, or aluminum, or a combination. Other suitable conductor material such as a doped semiconductor, for example, doped polysilicon material may be used. In a specific embodiment, first top wiring structure 2106 has a portion that includes a metal material in direct contact with the amorphous silicon material. The metal material can be silver, gold, palladium, platinum, nickel, vanadium, or aluminum depending on the application. The metal material has a suitable diffusion characteristic in the first amorphous silicon material in a presence of an electric field. In a specific embodiment, the metal material forms a metal region in a portion of the amorphous silicon material when a voltage greater than a threshold voltage is applied. The resistive switching device is in a first state which is a high resistance state or a low current state. The metal region further includes a filament structure characterized by a length dependent on an operating voltage. For example, when a first positive bias is applied to first top wiring structure in a write operation, the filament structure extends and causes the switching device to be at a second state and a low resistance state. The filament structure retracts upon application of a negative bias voltage to the first top wiring structure in an erase cycle to revert the switching device to the first state or the low resistance state.

Referring again to FIG. 21, the non-volatile memory device includes a thin film transistor 2120. The thin film transistor includes a gate structure 2122 overlying a gate dielectric layer 2124. The gate structure can include a second polysilicon material in a specific embodiment. The second polysilicon material is preferably doped with a suitable impurity species and can include a silicide in certain embodiments. The silicide can include nickel silicide, tungsten silicide or cobalt silicide depending on the application. The silicide reduces a resistivity of the gate structure in a specific embodiment. As shown, thin film transistor 2120 includes a source region 2126, a drain region 2128, and a channel region 2130. Channel region 2130 can be formed from a second amorphous silicon. Channel region 2130 is intrinsic or can be lightly doped depending on the embodiment. As shown, the drain region 2128 is in contact with first top wiring structure 2106 of the resistive switching device 2102 and the source region 2126 is in contact with the second top wiring structure. Alternatively the first top wiring structure can be in contact with the source region of the thin film transistor and the second top wiring structure can be in contact with the drain region depending on the embodiment. The thin film transistor provides for a control transistor for the resistive switching device in a specific embodiment. That is the thin film transistor controls, for example, the current or voltage applied to the resistive switching device to perform a write operation, a read operation, or an erase operation. The device structure illustrated has a device size of 6 $F^2$, where F is a feature size of the resistive switching device.

Depending on the application, there can be other variations. For example, the thin film transistor can be fabricated first, overlying the substrate, and the non-volatile memory cell can be fabricated on top of the thin film transistor device. In this implementation, the bottom wiring structure of the non-volatile memory cell can be electrically connected to the source region or the drain region of the thin film transistor steering element. In another embodiment, for example, the non-volatile memory device can include a second thin film transistor for the purpose of a select transistor, and others.

Additionally, a dielectric spacer structure can be formed overlying a portion of the gate structure to protect the gate structure in a specific embodiment.

Though the present invention has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A non-volatile memory device structure comprising:
a substrate having a surface region;
a first dielectric material overlying the surface region of the substrate;
a state change device overlying the first dielectric material, the state change device comprising a first wiring structure configured to spatially extend in a first direction, a switching element comprising at least a first undoped amorphous silicon material overlying the first wiring structure, and a second wiring structure configured to spatially extend in a second direction perpendicular to the first direction, the second wiring structure having a first portion and a second portion, the first portion comprising a first metal material overlying with the switching element; and
a first thin film transistor device operably connected with and at least in part overlying the state change device and comprising a first active region, a second active region, a gate structure overlying a gate dielectric layer, and a channel region, the first active region being configured to be in electrical contact with the first portion of the second wiring structure.

2. The device of claim 1 wherein the first thin film transistor device is a control transistor configured to cause the state change device to change from a first state to a second state, wherein the first state and the second state are selected, without replacement, from a group consisting of: a high resistance state, a low resistance state.

3. The device of claim 1 wherein each of the first active region, the second active region and the channel region comprises a second amorphous silicon material, wherein the first active region and the second active region are intentionally doped with an impurity species.

4. The device of claim 1 wherein the first wiring structure comprises a material selected from a group consisting of: copper, aluminum, tungsten, silver, a doped semiconductor material.

5. The device of claim 1 wherein the first active region is overlying with the first portion of the second wiring structure.

6. The device of claim 1 further comprises a second thin film transistor device operably coupled to the state change device and configured as a select transistor for the state change device.

7. The device of claim 1 wherein the gate structure comprises a material selected from a group consisting of: a polysilicon material, a polysilicon germanium (SiGe) material, a p type impurity characteristic material, an n type impurity characteristic material, a metal silicide material, the metal silicide material is selected from nickel silicide, cobalt silicide, tungsten silicide and titanium silicide.

8. The device of claim 1 where the gate structure comprises a metal material.

9. The device of claim 1 where the gate dielectric comprises silicon oxide, silicon nitride, aluminum oxide, hafnium oxide, or hafnium silicate (HfSiO2), a dielectric stack comprising alternating layers of silicon oxide and silicon nitride (ONO), or any combination thereof.

10. The device of claim 1 wherein the switching element comprises a pillar structure between a crossing of the first wiring structure and the second writing structure.

11. The device of claim 1 wherein the switching element further comprises a p+ polysilicon material interposed between the first undoped silicon material and the first wiring structure.

12. The device of claim 1 wherein the first metal material is selected from a group consisting of: silver, gold, palladium, platinum, nickel, vanadium, chromium, aluminum, a metal characterized by a diffusivity in a presence of an electric field.

13. The device of claim 1
wherein the state change device further comprises a thin oxide layer disposed between and in contact with the first metal material and in contact with the first undoped amorphous silicon material; and
wherein a thickness of the thin oxide layer is within the range of approximately 20 Å to approximately 50 Å.

14. The device of claim 1 having a size of 6 $F^2$, where F is a feature size of the state change device.

15. A non-volatile memory device structure comprising:
a substrate having a surface region;
a first dielectric material overlying the surface region of the substrate;
a first thin film transistor device overlying the first dielectric material; the first thin film transistor comprising a first active region, a second active region, a gate structure, and a channel region, the gate structure comprising at least a polysilicon material, and the channel region comprising at least a first amorphous silicon material;
a state change device overlying the substrate and the first dielectric material and at least in part underlying the first thin film transistor device, the state change device comprising a first wiring structure comprising a doped polysilicon material configured to spatially extend in a first direction, a switching element comprising at least a second undoped amorphous silicon material overlying and in contact with the first wiring structure, and a second wiring structure configured to spatially extend in a second direction perpendicular to the first direction, the second wiring structure having a portion comprising a metal material disposed above the switching element, the first wiring structure being in contact with the first active region of the thin film transistor device, the thin film transistor device being configured to cause the state change device to change from a first state to a second state.

16. The device of claim 15 wherein the state change device further comprises a thin oxide layer, wherein the thin oxide layer is disposed between and in contact with both the metal material and the switching element, wherein the thin oxide layer has a thickness within a range of approximately 20 Å to approximately 50 Å.

* * * * *